United States Patent
Raj et al.

(10) Patent No.: US 11,190,172 B1
(45) Date of Patent: Nov. 30, 2021

(54) LATCH-BASED LEVEL SHIFTER CIRCUIT WITH SELF-BIASING

(71) Applicant: XILINX, INC., San Jose, CA (US)

(72) Inventors: Mayank Raj, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/031,694

(22) Filed: Sep. 24, 2020

(51) Int. Cl.
*H03K 19/0185* (2006.01)
*H04B 17/18* (2015.01)
*H04B 10/516* (2013.01)
*H03K 3/356* (2006.01)

(52) U.S. Cl.
CPC .......... *H03K 3/356182* (2013.01); *H03K 19/018521* (2013.01)

(58) Field of Classification Search
None
See application file for complete search history.

(56) References Cited

U.S. PATENT DOCUMENTS

| 7,098,704 | B2* | 8/2006 | Ikezaki | H03K 17/167 326/87 |
| 7,692,483 | B2* | 4/2010 | Ng | H03K 3/356182 327/544 |
| 10,367,591 | B2 | 7/2019 | Raj | |

OTHER PUBLICATIONS

Raj, Mayank, et al., "A 50Gb/s Hybrid integrated Si-Photonic Optical Link in 16nm FinFET" 2019 Symposium on VLSI Circuits Digest of Technical Papers.

* cited by examiner

*Primary Examiner* — Kenneth B Wells
(74) *Attorney, Agent, or Firm* — Patterson + Sheridan, LLP

(57) ABSTRACT

Examples described herein generally relate to integrated circuits that include a latch-based level shifter circuit with self-biasing. In an example, an integrated circuit includes first and second latches and an output stage circuit. Each of the first and second latches includes a bias circuit electrically connected to a respective latch node and configured to provide a bias voltage at the respective latch node, which is electrically coupled to a signal input node. The output stage circuit has first and second input nodes electrically connected to first and second output nodes of the first and second latches, respectively, and a third output node. The output stage circuit is configured to responsively pull up and pull down a voltage of the third output node in response to respective voltages of the first and second input nodes.

20 Claims, 2 Drawing Sheets

LATCH-BASED LEVEL SHIFTER CIRCUIT WITH SELF-BIASING

GOVERNMENT RIGHTS

This invention was made with U.S. Government support under Agreement No. HR0011-19-3-0004 awarded by the Defense Advanced Research Projects Agency. The U.S. Government has certain rights in the invention.

TECHNICAL FIELD

Examples of the present disclosure generally relate to integrated circuits that include a latch-based level shifter circuit with self-biasing.

BACKGROUND

Integrated circuits (ICs) can implement a level shifter circuit to change a level or voltage swing of a signal. For example, a level shifter circuit can change a level or voltage swing of a signal that can be up to a first supply voltage to a level or voltage swing that can be up to a second, different supply voltage. Level shifter circuits can be implemented between different voltage domains in an IC. Level shifter circuits can be incorporated in or implemented as a driver circuit, such as an optical driver circuit. An optical driver circuit can, for example, change a voltage swing of a signal that can be up to a lower supply voltage of the IC (e.g., which is used to generate the signal) to a voltage swing that can be up to a higher supply voltage that is sufficient to drive an optical device.

SUMMARY

Examples described herein generally relate to integrated circuits that include a latch-based level shifter circuit with self-biasing. By providing biasing at a latch node, respective common mode voltages of signals output on output nodes of latches and input to an output stage circuit can remain at appropriate levels, even at high frequencies and/or at reduced supply voltages. Additionally, in some examples, an output signal output on the output node of the output stage circuit can retain a long sequence of a logical "1" and a long sequence of a logical "0" without droop.

An example described herein is an integrated circuit. The integrated circuit includes a first latch circuit, a second latch circuit, and an output stage circuit. The first latch circuit has a first latch node and a first output node. The first latch node is electrically coupled to a signal input node. The first latch circuit includes a first bias circuit electrically connected to the first latch node and configured to provide a bias voltage at the first latch node. The second latch circuit has a second latch node and a second output node. The second latch node is electrically coupled to the signal input node. The second latch circuit includes a second bias circuit electrically connected to the second latch node and configured to provide a bias voltage at the second latch node. The output stage circuit has a first input node, a second input node, and a third output node. The first input node is electrically connected to the first output node. The second input node is electrically connected to the second output node. The output stage circuit is configured to responsively pull up and pull down a voltage of the third output node in response to respective voltages of the first input node and the second input node.

Another example described herein is an integrated circuit. The integrated circuit includes a level shifter circuit. The level shifter circuit includes a non-level shifting latch circuit and a level shifting latch circuit. The non-level shifting latch circuit has a first latch node and a first output node. The first latch node is electrically coupled to a signal input node of the level shifter circuit. The non-level shifting latch circuit includes a first DC bias circuit configured to provide a first DC bias voltage at the first latch node. The level shifting latch circuit has a second latch node and a second output node. The second latch node is electrically coupled to the signal input node of the level shifter circuit. The level shifting latch circuit includes a second DC bias circuit configured to provide a second DC bias voltage at the second latch node.

Another example described herein is a method of operating an integrated circuit. An input signal is received at an input node. The input node is electrically coupled to a first latch node and a second latch node. A non-level shifting latch circuit includes the first latch node and a first DC bias circuit electrically connected to the first latch node. A level shifting latch circuit includes the second latch node and a second DC bias circuit electrically connected to the second latch node. A non-level shifted signal is generated by the non-level shifting latch circuit based on a signal on the first latch node. A level shifted signal is generated by the level shifting latch circuit based on a signal on the second latch node. An output signal is output from an output stage circuit. The output stage circuit generates the output signal in response to the non-level shifted signal and the level shifted signal.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
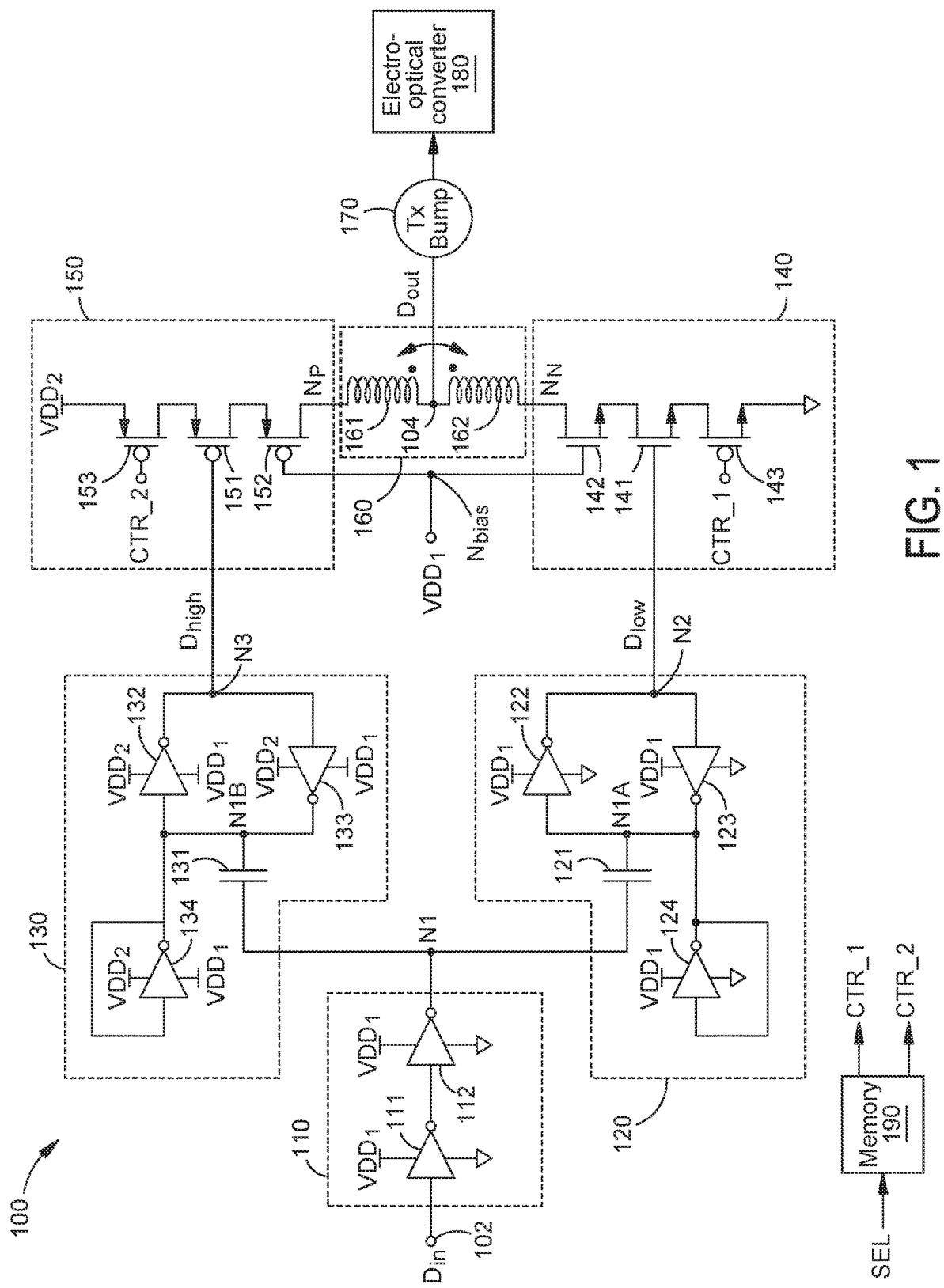
FIG. 1 shows an example level shifter circuit in accordance with some examples.

Examples described herein generally relate to integrated circuits that include a latch-based level shifter circuit with self-biasing. Aspects of examples described herein generally relate to level shifter circuits, although specific examples are described in the context of an optical driver circuit. Generally, in examples described herein, a level shifter circuit includes latches that are electrically connected between different pairs of supply nodes that are configured to be at different supply voltages. Each latch has a latch node that is biased. In some examples, the latch node is biased by being electrically connected to an input node and an output node of an inverter, such as a complementary device (e.g., complementary metal-oxide-semiconductor (CMOS)) inverter. Respective output nodes of the latches are electrically connected to input nodes of an output stage circuit that is configured to responsively pull up and pull down a voltage on an output node of the output stage circuit. By providing the biasing at the latch node, respective common mode voltages of signals output on the output nodes of the latches and input to the output stage circuit can remain at appropriate levels, even at high frequencies and/or at reduced supply voltages. Additionally, in some examples, by matching a drivability of, e.g., the biasing inverter with a drivability of a feedback inverter for each latch, an output signal output on the output node of the output stage circuit can retain a long sequence of a logical "1" and a long sequence of a logical "0" without droop.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

In the description that follows, various signals (e.g., voltages and/or currents) are described in the context of the operation of various circuits. A described signal indicates a corresponding node on which the signal is applied or propagated and further indicates nodes that are communicatively coupled and/or electrically connected. For example, description of a signal output from a first circuit and input to a second circuit indicates an output node of the first circuit (on which the signal is output from the first circuit) is communicatively coupled and/or electrically connected to an input node of the second circuit (on which the signal is input to the second circuit). Explicit description of such nodes may be omitted in the following description, but a person having ordinary skill in the art will readily understand the presence of the nodes.

FIG. 1 shows an example level shifter circuit in accordance with some examples. In the illustrated example, the level shifter circuit is also an optical driver circuit 100. The level shifter circuit, in this example, the optical driver circuit 100, is configured to receive an input signal $D_{in}$ that can have a relatively low voltage swing and generate an output signal $D_{out}$ that can have a relatively high voltage swing. For purposes of discussion herein, the input signal $D_{in}$ may have a relatively low voltage swing between a first supply voltage $VDD_1$ and ground potential, and the output signal $D_{out}$ may have a relatively high voltage swing between a second supply voltage $VDD_2$ and ground potential, where the second supply voltage $VDD_2$ is greater than the first supply voltage $VDD_1$. In some aspects, the first supply voltage $VDD_1$ may be equal to approximately 0.9 volts, and the second supply voltage $VDD_2$ may be equal to approximately 1.8 volts. In other examples, the first supply voltage $VDD_1$ and second supply voltage $VDD_2$ may be of other suitable voltages.

The example of FIG. 1 is illustrated and described with a ground node, a first supply node $VDD_1$, and a second supply node $VDD_2$ (on which a ground potential, the first supply voltage $VDD_1$, and the second supply voltage $VDD_2$ are provided). In other examples, different supply voltages or potentials can be implemented. More generally, the ground node and ground potential can be thought of as a first supply node and first supply voltage, respectively; the first supply node $VDD_1$ and first supply voltage $VDD_1$ can be thought of as a second supply node and second supply voltage, respectively; and the second supply node $VDD_2$ and second supply voltage $VDD_2$ can be thought of as a third supply node and third supply voltage, respectively. In this generic formulation, the second supply voltage is greater than the first supply voltage, and the third supply voltage is greater than the second supply voltage.

The optical driver circuit 100 includes a buffer circuit 110, a non-level shifting latch circuit 120, a level shifting latch circuit 130, a pull-down circuit 140, a pull-up circuit 150, and an inductive circuit 160. In the illustrated example, the buffer circuit 110 is configured to receive, on an input node 102, the input signal $D_{in}$, and the pull-down circuit 140, the pull-up circuit 150, and inductive circuit 160 form an output stage circuit of the optical driver circuit 100 that provides, on an output node 104 of the optical driver circuit 100, the output signal $D_{out}$ to a transmitter (TX) bump 170. The TX bump 170 may be coupled to an electro-optical converter 180 such as, for example, an electro-absorption modulator (EAM), a ring modulator (RM), or any other suitable electro-optical converter.

Although described as an optical driver circuit 100, the buffer circuit 110, non-level shifting latch circuit 120, level shifting latch circuit 130, pull-down circuit 140, and pull-up circuit 150 can be implemented as a latch-based level shifter circuit for any appropriate application. A person having ordinary skill in the art will readily understand such applications.

The buffer circuit 110 has an input node that is or is electrically connected to the input node 102 and that is configured to receive the input signal $D_{in}$. The buffer circuit 110 includes an inverter 111 and an inverter 112 electrically connected in series between the input node 102 and a first node N1. An input node of the inverter 111 is electrically connected to the input node 102 of the buffer circuit 110. An output node of the inverter 111 is electrically connected to an input node of the inverter 112. An output node of the inverter 112 is an output node of the buffer circuit 110 and is electrically connected to the first node N1. The inverter 111 and inverter 112 include power nodes electrically connected to a first supply node $VDD_1$ and a ground node. The first supply node $VDD_1$ is configured to be at the first supply voltage $VDD_1$ in operation, and the ground node is configured to be at a ground potential in operation. The inverter 111 and inverter 112 may be used to buffer and drive the input signal $D_{in}$ to have a rail-to-rail voltage swing between a ground potential (e.g., 0 volts) and the first supply voltage $VDD_1$. In some examples, the inverter 111 and inverter 112 each may be a complementary device (e.g., CMOS) inverter.

The output node of the buffer circuit 110 (e.g., which is electrically connected to the first node N1) is electrically connected to an input node of the non-level shifting latch circuit 120 and to an input node of the level shifting latch circuit 130. The non-level shifting latch circuit 120 includes a capacitor 121 and inverters 122, 123, 124. A first terminal of the capacitor 121 is the input node of the non-level shifting latch circuit 120 and is electrically connected to the output node of the buffer circuit 110. A second terminal of the capacitor 121 (opposite from the first terminal of the capacitor 121), an input node of the inverter 122, an output node of the inverter 123, and input and output nodes of the inverter 124 are electrically connected together and form a latch node N1A. An output node of the inverter 122 and an input node of the inverter 123 are electrically connected together and form an output node N2 of the non-level shifting latch circuit 120. The output node N2 of the non-level shifting latch circuit 120 is electrically connected to an input node of the pull-down circuit 140. The inverters 122, 123, 124 each include power nodes electrically connected to the first supply node $VDD_1$ and a ground node. In some examples, the inverters 122, 123, 124 each may be a complementary device (e.g., CMOS) inverter.

The capacitor 121 may block DC components of the input signal $D_{in}$. The inverters 122, 123 form an inverting latch that is configured to store, at the output node N2, a logically complemented value of the input signal $D_{in}$. The inverter 124, as electrically connected, is a DC bias circuit and provides a self-bias voltage to the non-level shifting latch circuit 120. The self-biasing (e.g., a DC bias voltage) provided by the inverter 124 permits the latch formed by the inverters 122, 123 to maintain a proper bias, such as even when a transition strength at the latch node N1A is small, like when the operating first supply voltage $VDD_1$ is below a nominal value. This further permits the logically complemented value stored at the output node N2 to maintain a proper common mode voltage. With the capacitor 121 blocking DC components, the latch formed by the inverters 122, 123 can transition between logical states at edges of the input signal $D_{in}$.

The level shifting latch circuit 130 includes a capacitor 131 and inverters 132, 133, 134. A first terminal of the capacitor 131 is the input node of the level shifting latch circuit 130 and is electrically connected to the output node of the buffer circuit 110. A second terminal of the capacitor 131 (opposite from the first terminal of the capacitor 131), an input node of the inverter 132, an output node of the inverter 133, and input and output nodes of the inverter 134 are electrically connected together and form a latch node N1B. An output node of the inverter 132 and an input node of the inverter 133 are electrically connected together and form an output node N3 of the level shifting latch circuit 130. The output node N3 of the level shifting latch circuit 130 is electrically connected to an input node of the pull-up circuit 150. The inverters 132, 133, 134 each include power nodes electrically connected to a second supply node $VDD_2$ and the first supply node $VDD_1$. The second supply node $VDD_2$ is configured to be at the second supply voltage $VDD_2$ in operation. In some examples, the inverters 132, 133, 134 each may be a complementary device (e.g., CMOS) inverter.

The capacitor 131 may block DC components of the input signal $D_{in}$. The inverters 132, 133 form an inverting latch that is configured to store, at the output node N3, a logically complemented value of the input signal $D_{in}$. Moreover, because the power nodes of the inverters 132, 133 are electrically connected between the second supply node $VDD_2$ and the first supply node $VDD_1$, on which the second supply voltage $VDD_2$ and the first supply voltage $VDD_1$, respectively, are provided, the level shifting latch circuit 130 may also level shift the input signal $D_{in}$ to generate a level shifted signal $D_{high}$, which is a logically complemented value of the input signal $D_{in}$, having a voltage swing between approximately the second supply voltage $VDD_2$ and the first supply voltage $VDD_1$. The inverter 134, as electrically connected, is a DC bias circuit and provides a self-bias voltage to the level shifting latch circuit 130. The self-biasing (e.g., a DC bias voltage) provided by the inverter 134 permits the latch formed by the inverters 132, 133 to maintain a proper bias, such as even when a transition strength at the latch node N1B is small, like when the operating second supply voltage $VDD_2$ is below a nominal value. This further permits the logically complemented value stored at the output node N3 to maintain a proper common mode voltage. With the capacitor 131 blocking DC components, the latch formed by the inverters 132, 133 can transition between logical states at edges of the input signal $D_{in}$.

In operation, the inverter 124 provides a bias voltage, which can be $VDD_1/2$ in the illustrated example if the ground potential is assumed to be 0 V, at latch node N1A, and the inverter 134 provides a bias voltage, which can be $(VDD_2+VDD_1)/2$ in the illustrated example, at latch node N1B. When the input signal $D_{in}$ is driven to a high logic state, the signal on the first node N1 is driven to a high logic state (e.g., to the first supply voltage $VDD_1$) by the buffer circuit 110, which causes the respective signals on the latch nodes N1A, N1B to be driven to a high logic state (e.g., to the first supply voltage $VDD_1$).

In response to the high logic state on latch node N1A, the inverter 122 drives the output node N2 to a low logic state (e.g., to ground potential), and in response to the low logic state on the output node N2, the inverter 123 attempts to drive the latch node N1A high towards the first supply voltage $VDD_1$. The inverter 124 attempts to drive the latch node N1A towards the bias voltage (e.g., $VDD_1/2$). In some examples, the drivability of the inverters 123, 124 are equal. More specifically, each n-type transistor of the inverter 123 can have a same channel width and channel length as a respective n-type transistor of the inverter 124 (and vice versa), and each n-type transistor of the inverter 123 can have a same channel width and channel length as a respective p-type transistor of the inverter 124 (and vice versa). The inverter 123 can have the same physical layout as the inverter 124 in the integrated circuit. Assuming a same drivability for the inverters 123, 124, the latch node N1A is driven towards $(3/4)VDD_1$, which is greater than a switching threshold for the inverter 122 that causes the inverter 122 to continue driving the output node N2 to a low logic state.

In response to the high logic state on latch node N1B, the inverter 132 drives the output node N3 to a low logic state (e.g., to the first supply voltage $VDD_1$), and in response to the low logic state on the output node N3, the inverter 133 attempts to drive the latch node N1B high towards the second supply voltage $VDD_2$. The inverter 134 attempts to drive the latch node N1B towards the bias voltage (e.g., $(VDD_2+VDD_1)/2$). In some examples, the drivability of the inverters 133, 134 are equal. More specifically, each n-type transistor of the inverter 133 can have a same channel width and channel length as a respective n-type transistor of the inverter 134 (and vice versa), and each n-type transistor of the inverter 133 can have a same channel width and channel length as a respective p-type transistor of the inverter 134 (and vice versa). The inverter 133 can be a same physical layout as the inverter 134 in the integrated circuit. Assuming a same drivability for the inverters 133, 134, the latch node N1B is driven towards $[(3/4)VDD_2+(1/4)VDD_1]$, which is greater than a switching threshold for the inverter 132 that causes the inverter 132 to continue driving the output node N3 to a low logic state.

When the input signal $D_{in}$ is driven to a low logic state, the signal on the first node N1 is driven to a low logic state (e.g., to a ground potential) by the buffer circuit 110, which causes the respective signals on the latch nodes N1A, N1B to be driven to a low logic state (e.g., to a ground potential).

In response to the low logic state on latch node N1A, the inverter 122 drives the output node N2 to a high logic state (e.g., to the first supply voltage $VDD_1$), and in response to the high logic state on the output node N2, the inverter 123 attempts to drive the latch node N1A low towards a ground potential. The inverter 124 attempts to drive the latch node N1A towards the bias voltage (e.g., $VDD_1/2$). Assuming a same drivability for the inverters 123, 124 as described above, the latch node N1A is driven towards $(\frac{1}{4})VDD_1$, which is less than a switching threshold for the inverter 122 that causes the inverter 122 to continue driving the output node N2 to a high logic state.

In response to the low logic state on latch node N1B, the inverter 132 drives the output node N3 to a high logic state (e.g., to the second supply voltage $VDD_2$), and in response to the high logic state on the output node N3, the inverter 133 attempts to drive the latch node N1B low towards the first supply voltage $VDD_1$. The inverter 134 attempts to drive the latch node N1B towards the bias voltage (e.g., $(VDD_2+VDD_1)/2$). Assuming a same drivability for the inverters 133, 134 as described above, the latch node N1B is driven towards $[(\frac{1}{4})VDD_2+(\frac{3}{4})VDD_1]$, which is less than a switching threshold for the inverter 132 that causes the inverter 132 to continue driving the output node N3 to a high logic state.

Since the power nodes of the inverters 122, 123, 124 are electrically connected to the first supply node $VDD_1$ and a ground node, the input signal $D_{in}$ may not be level shifted by the inverters 122, 123. The non-level shifting latch circuit 120 may provide, via the output node N2, a non-level shifted signal $D_{low}$ to the pull-down circuit 140 that is a logical complement of the input signal $D_{in}$. The level shifting latch circuit 130 can cause the voltage swing of the input signal $D_{in}$ to be level shifted from a relatively low voltage range (between 0 volts and the first supply voltage $VDD_1$) to a relatively high voltage range (between the first supply voltage $VDD_1$ and the second supply voltage $VDD_2$). The resulting level shifted signal $D_{high}$, which is a logical complement of the input signal $D_{in}$, may be provided to the pull-up circuit 150 via the output node N3.

The pull-down circuit 140 includes a first n-type transistor 141 (e.g., an n-type field effect transistor (FET)), a second n-type transistor 142, and a third n-type transistor 143. A gate node of the first n-type transistor 141 is the input node of the pull-down circuit 140 electrically connected to the output node N2 of the non-level shifting latch circuit 120 to provide the non-level shifted signal $D_{low}$ to the pull-down circuit 140. The first n-type transistor 141 has a drain node electrically connected to a source node of the second n-type transistor 142. The second n-type transistor 142 has a gate node electrically connected to a bias node $N_{bias}$, and has a drain node electrically connected to an output node $N_N$ inductively coupled to the output node 104 of the optical driver circuit 100. The bias node $N_{bias}$, in the illustrated example, is electrically connected to the first supply node $VDD_1$. The first n-type transistor 141 has a source node electrically connected to a drain node of the third n-type transistor 143. The third n-type transistor 143 has a gate node electrically connected to a first control node CTR_1, and has a source node electrically connected to a ground node.

The pull-up circuit 150 includes a first p-type transistor 151 (e.g., a p-type FET), a second p-type transistor 152, and a third p-type transistor 153. A gate node of the first p-type transistor 151 is the input node of the pull-up circuit 150 electrically connected to the output node N3 of the level shifting latch circuit 130 to provide the level shifted signal $D_{high}$ to the pull-up circuit 150. The first p-type transistor 151 has a drain node electrically connected to a source node of the second p-type transistor 152. The second p-type transistor 152 has a gate node electrically connected to the bias node $N_{bias}$, and has a drain node electrically connected to an output node $N_P$ inductively coupled to the output node 104 of the optical driver circuit 100. The first p-type transistor 151 has a source node electrically connected to a drain node of the third p-type transistor 153. The third p-type transistor 153 has a gate node electrically connected to a second control node CTR_2, and has a source node electrically connected to the second supply node $VDD_2$.

Generally, a first control signal CTR_1 applied on the first control node CTR_1 may be used to control or adjust falling edge transitions of the output signal $D_{out}$ on the output node 104, and a second control signal CTR_2 applied on the second control node CTR_2 may be used to control or adjust rising edge transitions of the output signal $D_{out}$. More specifically, the pull-down circuit 140 may be configured to adjust falling edge transitions of the output signal $D_{out}$ based on the first control signal CTR_1, and the pull-up circuit 150 may be configured to adjust rising edge transitions of the output signal $D_{out}$ based on the second control signal CTR_2. In some aspects, the pull-up circuit 150 and the pull-down circuit 140 may control or adjust rising and falling edge transitions of the output signal $D_{out}$, respectively, independently of each other.

The inductive circuit 160 includes a first inductor 161 and a second inductor 162 electrically connected between the pull-up circuit 150 and the pull-down circuit 140. As depicted in FIG. 1, the first inductor 161 is electrically connected between the drain node of the second p-type transistor 152 (e.g., the output node $N_P$) and the output node 104, and the second inductor 162 is electrically connected between the drain node of the second n-type transistor 142 (e.g., the output node $N_N$) and the output node 104. In some implementations, the inductors 161, 162 may each be of the same size and shape, and may be stacked on top of each other within an integrated circuit chip in which the optical driver circuit 100 is disposed. In this manner, the inductors 161, 162 may be electromagnetically coupled to each other, thereby resulting in a mutual inductance between the inductors 161, 162 that may increase the overall inductance of the inductive circuit 160.

As noted above, when the input signal $D_{in}$ is driven to a high logic state (e.g., at or near the first supply voltage $VDD_1$), the inverter 122 drives the output node N2 to a low logic state (e.g., to ground potential), and the inverter 132 drives the output node N3 to a low logic state (e.g., to the first supply voltage $VDD_1$). Hence, in such a situation, the non-level shifted signal $D_{low}$ is a low logic state (e.g., ground potential), and the level shifted signal $D_{high}$ is a low logic state (e.g., the first supply voltage $VDD_1$).

The non-level shifted signal $D_{low}$ being low (e.g., ground potential) maintains the first n-type transistor 141 in a non-conductive or open state, thereby isolating the output node 104 from ground potential. The level shifted signal $D_{high}$ being low (e.g., the first supply voltage $VDD_1$) may turn on the first p-type transistor 151 to a conductive or closed state, which may be affected by the state of the third p-type transistor 153 resulting from the second control signal CTR_2. Additionally, the first supply voltage $VDD_1$ is applied to the gate node of second p-type transistor 152, and therefore the second p-type transistor 152 may also be turned on, which may be affected by the state of the third p-type transistor 153. As a result, the first p-type transistor 151 and second p-type transistor 152 may both be in a conductive state, and may pull the output node 104 high towards the second supply voltage $VDD_2$ through the first inductor 161.

When the input signal $D_{in}$ is driven to a low logic state (e.g., at or near ground potential), the inverter 122 drives the output node N2 to a high logic state (e.g., to the first supply voltage $VDD_1$), and the inverter 132 drives the output node N3 to a high logic state (e.g., to the second supply voltage $VDD_2$). Hence, the non-level shifted signal $D_{low}$ is a high logic state (e.g., the first supply voltage $VDD_1$), and the level shifted signal $D_{high}$ is a high logic state (e.g., the second supply voltage $VDD_2$).

The non-level shifted signal $D_{low}$ being high (e.g., the first supply voltage $VDD_1$) may turn on the first n-type transistor 141 to a conductive or closed state, which may be affected by the state of the third n-type transistor 143 resulting from the first control signal CTR_1. Additionally, the first supply voltage $VDD_1$ is applied to the gate node of the second n-type transistor 142, and therefore the second n-type transistor 142 may also be turned on, which may be affected by the state of the third n-type transistor 143. As a result, first n-type transistor 141 and second n-type transistor 142 may both be in a conductive state, and may pull the output node 104 low towards ground potential through the second inductor 162. The level shifted signal $D_{high}$ being high (e.g., the second supply voltage $VDD_2$) maintains the first p-type transistor 151 in a non-conductive or open state, thereby isolating the output node 104 from second supply voltage $VDD_2$.

The optical driver circuit 100 is configured to increase the voltage swing of electrical signals, e.g., to levels more suitable for optical signals. More specifically, while the input signal $D_{in}$ has a voltage swing between ground potential and the first supply voltage $VDD_1$ (e.g., between 0 V and 0.9 V), the output signal $D_{out}$ generated by the optical driver circuit 100 has a voltage swing between ground potential and the second supply voltage $VDD_2$ (e.g., between 0 V and 1.8 V).

The inductive circuit 160 may reduce or isolate parasitic capacitances within the pull-down circuit 140 and the pull-up circuit 150, thereby allowing for faster edge transitions in the output signal $D_{out}$ by reducing the overall load capacitance of the optical driver circuit 100. More specifically, the first inductor 161 may reduce or isolate parasitic capacitances within the pull-up circuit 150 during rising edge transitions of the output signal $D_{out}$, and the second inductor 162 may reduce or isolate parasitic capacitances within the pull-down circuit 140 during falling edge transitions of the output signal $D_{out}$. Hence, with large data rates, the optical driver circuit 100 of FIG. 1 may be able to transition the output signal $D_{out}$ between ground potential and the second supply voltage $VDD_2$ (such as between logic low and logic high states, respectively) with sufficient speed. The inductive circuit 160 may accommodate a relatively large output load capacitance associated with the TX bump 170 (which in some implementations may be between 70-90 fF) and/or the electro-optical converter 180, for example.

In addition, non-linear distortion resulting from one or more components of the electro-optical converter 180 may cause the electro-optical converter 180 to have asymmetric responses to rising and falling edges of the output signal $D_{out}$, which may undesirably cause the converted optical signals to have asymmetric rising and falling edges. The optical driver circuit 100 may also compensate for non-linear distortion caused by the electro-optical converter 180, for example, by independently adjusting the rising and falling edge transitions of the output signals. In this manner, the optical driver circuits disclosed herein may compensate for asymmetric responses of electro-optical converters to rising and rising edge transitions of output signals generated by the optical driver circuits.

In some examples, the first control signal CTR_1 and second control signal CTR_2 may be based at least in part on information indicating the asymmetric responses of the electro-optical converter 180 to rising and falling edge transitions of the output signal $D_{out}$. In this manner, the speed of rising edge transitions of the output signal $D_{out}$ and/or the speed of falling edge transitions of the output signal $D_{out}$ may be adjusted by the first control signal CTR_1 and second control signal CTR_2, respectively, to provide pre-emphasis in the output signal $D_{out}$ to compensate for non-linearities inherent in the electro-optical converter 180.

The first control signal CTR_1 may independently control or adjust the speed with which the pull-down circuit 140 pulls the output node 104 low towards ground potential during falling edge transitions of the output signal $D_{out}$ by selectively adjusting the voltage applied to the gate node of the third n-type transistor 143. For example, a voltage of the first control signal CTR_1 may be increased (such as to a more positive voltage) to increase current flow through the third n-type transistor 143 and thereby increase the speed of falling edge transitions of the output signal $D_{out}$, and the voltage of the first control signal CTR_1 may be decreased (such as to a less positive voltage) to decrease current flow through the third n-type transistor 143 and thereby decrease the speed of falling edge transitions of the output signal $D_{out}$. Similarly, the second control signal CTR_2 may independently control or adjust the speed with which the pull-up circuit 150 pulls the output node 104 high towards the second supply voltage $VDD_2$ during rising edge transitions of the output signal $D_{out}$ by selectively adjusting the voltage applied to the gate node of the third p-type transistor 153. For example, a voltage of the second control signal CTR_2 may be decreased (such as to a less positive voltage) to increase current flow through the third p-type transistor 153 and thereby increase the speed of rising edge transitions of the output signal $D_{out}$, and the voltage of the second control signal CTR_2 may be increased (such as to a more positive voltage) to decrease current flow through the third p-type transistor 153 and thereby decrease the speed of rising edge transitions of the output signal $D_{out}$. In this manner, the optical driver circuit 100 may cause the rising and falling edge transitions of the output signal $D_{out}$ to exhibit an asymmetry that compensates for asymmetrical responses of the electro-optical converter 180.

The first control signal CTR_1 and second control signal CTR_2 may be generated by any suitable circuit provided within or coupled to the optical driver circuit 100. For the example depicted in FIG. 1, the optical driver circuit 100 is shown to include a memory 190 configured to provide or generate the first control signal CTR_1 and second control signal CTR_2. The memory 190 may be any suitable memory circuit or storage device (such as non-volatile memory) that can store voltage levels or values indicative of voltage levels for the first control signal CTR_1 and second control signal CTR_2. In some examples, the memory 190 may store a plurality of voltages or values for each of the first control signal CTR_1 and second control signal CTR_2.

In some examples, the memory 190 may be coupled to one or more digital-to-analog converters (DACs) that are electrically coupled to the first control node CTR_1 and the second control node CTR_2. The voltages or values stored in the memory 190 for the first control signal CTR_1 and second control signal CTR_2 may be based on asymmetric response behavior of the electro-optical converter 180. In some aspects, the asymmetric response behavior of the electro-optical converter 180 may be determined using eye diagrams, for example. In other aspects, the electro-optical converter 180 may provide a feedback signal indicating its asymmetric response to rising and falling edge transitions of the output signal $D_{out}$, and the feedback signal may be used to select and/or update voltages or values for each of the first control signal CTR_1 and second control signal CTR_2 stored in the memory 190.

The memory 190 may be programmed by a manufacturer of the optical driver circuit 100, by a tester of the optical driver circuit 100, by a user of the optical driver circuit 100, or any combination thereof. In some aspects, the memory 190 may be programmed with suitable values for the first control signal CTR_1 and second control signal CTR_2 in the field (such as by manual programming or by an over the air (OTA) update). In addition, or in the alternative, values stored in the memory 190 for the first control signal CTR_1 and second control signal CTR_2 may be dynamically updated in the field.

In some other embodiments, the memory 190 may be or include a look-up table (LUT) to store multiple voltages or values for each of the first control signal CTR_1 and second control signal CTR_2 that can be selected, for example, in response to a select signal. The select signal may be based on, or may indicate, a desired edge transition setting that compensates for the asymmetric response of the electro-optical converter 180. In this manner, the optical driver circuit 100 may provide a level of pre-emphasis in the output signal $D_{out}$ to compensate for non-linearities in the electro-optical converter 180.

In some examples, the inductors 161, 162 and/or transistors 143, 153 (and corresponding memory 190) can be omitted. For example, a level shifter circuit, where pre-distorting for non-linearities is not a concern, can omit transistors 143, 153 and memory 190. In such an example, the source node of the first n-type transistor 141 can be electrically connected to the ground node, and the source node of the first p-type transistor 151 can be electrically connected to the second supply node $VDD_2$. Further, a level shifter circuit, where load capacitance and/or speed is not a concern, can omit the inductors 161, 162. In such an example, the drain node of the second n-type transistor 142 can be electrically connected to the output node 104, and the drain node of the second p-type transistor 152 can be electrically connected to the output node 104. A level shifter circuit can be implemented, for example, between different power domains on a same integrated circuit chip, between different power domains on respective different integrated circuit chips, or in other applications.

Referring to the optical driver circuit 100 generally, the inverters 124, 134 that provide a self-bias in the non-level shifting latch circuit 120 and the level shifting latch circuit 130, respectively, can cause the non-level shifted signal $D_{low}$ and the level shifted signal $D_{high}$ (which are output from the non-level shifting latch circuit 120 and the level shifting latch circuit 130, respectively) to maintain a proper common mode voltage. Without the inverters 124, 134, it was observed that at high frequencies (e.g., 26.5 GHz and greater) when a supply voltage was reduced, the common mode voltage of the non-level shifted signal $D_{low}$ and the level shifted signal $D_{high}$ was decreased, which caused these signals to be insufficient to cause the pull-up circuit 150 and/or pull-down circuit 140 to pull up and/or pull down, respectively, the voltage of the output node 104. Hence, at high frequencies with a reduced supply voltage, without the inverters 124, 134, an optical driver circuit was observed to not be able to drive the output signal $D_{out}$ at the output node appropriately. With the inverters 124, 134, the common mode voltage of the non-level shifted signal $D_{low}$ and the level shifted signal $D_{high}$ can be maintained at an appropriate level that can cause the pull-up circuit 150 and pull-down circuit 140 to pull up and pull down, respectively, the voltage of the output node 104. Hence, at high frequencies with a reduced supply voltage, with the inverters 124, 134, the optical driver circuit 100 can drive the output signal $D_{out}$ at the output node 104 appropriately.

Even further, common mode voltage of the non-level shifted signal $D_{low}$ and the level shifted signal $D_{high}$ can be maintained across a large span of frequencies and with different supply voltages. Again, without the inverters 124, 134, it was observed that when the first supply voltage $VDD_1$ was at a nominal voltage (e.g., $VDD_1$=0.9), the common mode voltage of the signals $D_{low}$, $D_{high}$, would fall to an incorrect level at frequencies of approximately 29.4 GHz and greater. Without the inverters 124, 134 and when the first supply voltage $VDD_1$ was reduced, such as due to process-voltage-temperature (PVT) variation, the common mode voltage of the signals $D_{low}$, $D_{high}$, would fall to an incorrect level at lower frequencies, such as at approximately 29.4 GHz and greater for $VDD_1$=0.88 V and at approximately 22.8 GHz and greater for $VDD_1$=0.86 V. With the inverters 124, 134, the common mode voltage of the signals $D_{low}$, $D_{high}$ can be maintained at an appropriate level through observed frequencies, such as up to 40 GHz.

As noted above, in some examples, the inverters 123, 124 have a same drivability, and the inverters 133, 134 have a same drivability. This can permit the latch nodes N1A, N1B of the non-level shifting latch circuit 120 and the level shifting latch circuit 130 to transition between high and low logic states at a high frequency and can permit the output signal $D_{out}$ to maintain respective voltages for low and high logic states without droop when a long sequence of low logic states (e.g., a long sequence of logical "0"s) and a long sequence of high logic states (e.g., a long sequence of logical "1"s), respectively, are input as the input signal $D_{in}$. The ability to maintain respective voltages for low and high logic states without droop when a long sequence of low and high logic states are input shows that the optical driver circuit 100 can operate at low frequencies, which illustrates that bandwidth (e.g., at lower frequencies) is not adversely affected. It is noted that, in other examples, the inverters 123, 124 can have different drivabilities, and the inverters 133, 134 can have different drivabilities. A same or similar effect can be achieved by inverters having different drivabilities by balancing having a sufficiently large drivability to achieve a target common mode voltage with having a sufficiently small drivability to permit the respective latch circuit to transition between high and low states.

Figure 2:
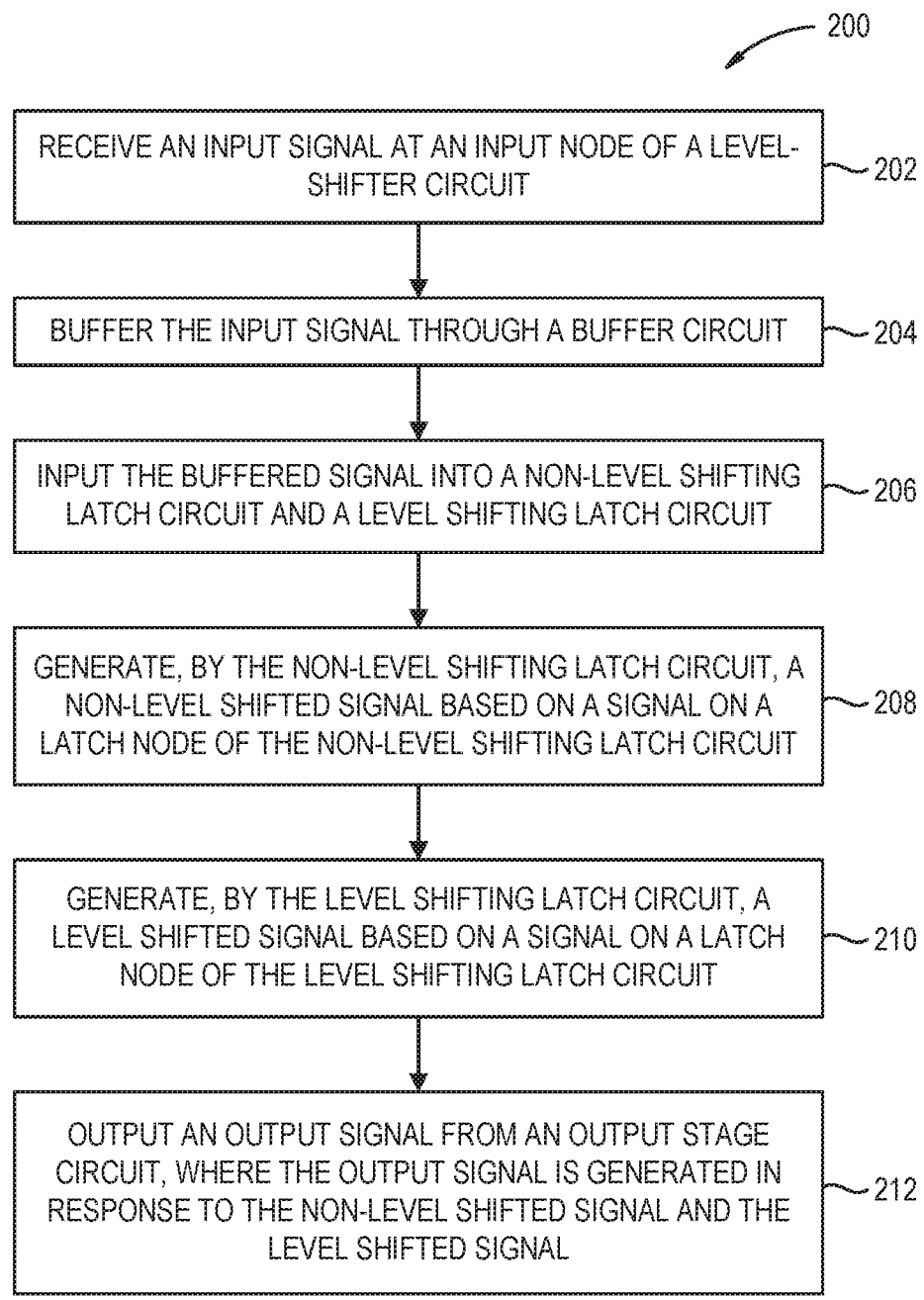
FIG. 2 is a flowchart of a method for operating an integrated circuit that includes a level shifter circuit according to some examples.

FIG. 2 is a flowchart of a method 200 for operating an integrated circuit that includes a level shifter circuit according to some examples. The method 200 is described in the context of the optical driver circuit 100 of FIG. 1. In the following description of the method 200 in the context of the optical driver circuit 100, it is assumed that the first control signal CTR_1 and second control signal CTR_2 are set to appropriate values. A person having ordinary skill in the art will readily understand the applicability of the description of the method 200 to other level shifter circuits.

At block 202, an input signal is received at an input node of the level shifter circuit. For example, an input signal $D_{in}$ is received at an input node 102. In some examples, the input signal $D_{in}$ has a voltage swing between a ground potential and a first supply voltage $VDD_1$.

At block 204, the input signal is buffered through a buffer circuit. For example, the input signal $D_{in}$ is input to the buffer circuit 110 and the buffered signal is output on the first node N1. In some examples, the buffered signal has a voltage swing between a ground potential and a first supply voltage $VDD_1$.

At block 206, the buffered signal is input into a non-level shifting latch circuit and into a level shifting latch circuit. For example, the signal on the first node N1 is input into non-level shifting latch circuit 120 and into level shifting latch circuit 130. The non-level shifting latch circuit 120 includes a latch node N1A, and the level shifting latch circuit 130 includes a latch node N1B. The latch nodes N1A, N1B are electrically coupled to the first node N1 through respective capacitors 121, 131, and further, to the input node 102 through the buffer circuit 110. The non-level shifting latch circuit 120 has a DC bias circuit (e.g., the inverter 124) that is electrically connected to, and configured to provide a bias voltage to, the latch node N1A. The level shifting latch circuit 130 has a DC bias circuit (e.g., the inverter 134) that is electrically connected to, and configured to provide a bias voltage to, the latch node N1B. The non-level shifting latch circuit 120 has power nodes electrically connected to a ground node and a first supply node $VDD_1$ that provide a ground potential and a first supply voltage $VDD_1$, respectively, to the non-level shifting latch circuit 120. The level shifting latch circuit 130 has power nodes electrically connected to the first supply node $VDD_1$ and a second supply node $VDD_2$ that provide the first supply voltage $VDD_1$ and a second supply voltage $VDD_2$, respectively, to the level shifting latch circuit 130. The second supply voltage $VDD_2$ is greater than the first supply voltage $VDD_1$.

At block 208, a non-level shifted signal is generated by the non-level shifting latch circuit based on a signal on a latch node of the non-level shifting latch circuit. For example, the non-level shifting latch circuit 120 generates a non-level shifted signal $D_{low}$ based on the signal on the latch node N1A. The non-level shifted signal $D_{low}$ is a logical complement of the signal on the latch node N1A, e.g., resulting from the inverter 122. In some examples, the non-level shifted signal $D_{low}$ has a voltage swing between a ground potential and the first supply voltage $VDD_1$.

At block 210, a level shifted signal is generated by the level shifting latch circuit based on a signal on a latch node of the level shifting latch circuit. For example, the level shifting latch circuit 130 generates a level shifted signal $D_{high}$ based on the signal on the latch node N1B. The level shifted signal $D_{high}$ is a logical complement of the signal on the latch node N1B, e.g., resulting from the inverter 132. In some examples, the level shifted signal $D_{high}$ has a voltage swing between the first supply voltage $VDD_1$ and the second supply voltage $VDD_2$.

At block 212, an output signal is output from an output stage circuit, where the output signal is generated in response to the non-level shifted signal and the level shifted signal. For example, the output stage circuit includes pull-down circuit 140 and pull-up circuit 150. The pull-down circuit 140 is electrically connected between a ground node and the output node 104, and the pull-up circuit 150 is electrically connected between the output node 104 and the second supply node $VDD_2$. The pull-down circuit 140 responsively pulls down the voltage of the output node 104 and electrically isolates the output node 104 from the ground node based on the non-level shifted signal $D_{low}$. When the non-level shifted signal $D_{low}$ is logically high, the pull-down circuit 140 pulls the voltage of the output node 104 down towards a ground potential, and when the non-level shifted signal $D_{low}$ is logically low, the pull-down circuit 140 electrically isolates the output node 104 from the ground node. The pull-up circuit 150 responsively pulls up the voltage of the output node 104 and electrically isolates the output node 104 from the second supply node $VDD_2$ based on the level shifted signal $D_{high}$. When the level shifted signal $D_{high}$ is logically low, the pull-up circuit 150 pulls the voltage of the output node 104 up towards the second supply voltage $VDD_2$, and when the non-level shifted signal $D_{low}$ is logically high, the pull-up circuit 150 electrically isolates the output node 104 from the second supply node $VDD_2$. The voltage on the output node 104 forms the output signal $D_{out}$. In some examples, the output signal $D_{out}$ has a voltage swing between the ground potential and the second supply voltage $VDD_2$.

While the foregoing is directed to specific examples, other and further examples may be devised without departing from the basic scope thereof, and the scope thereof is determined by the claims that follow.

What is claimed is:

1. An integrated circuit comprising:
   a first latch circuit having a first latch node and a first output node, the first latch node being electrically coupled to a signal input node, the first latch circuit comprising a first capacitor coupled between the signal input node on a first side of the first capacitor and the first latch node on a second side of the first capacitor and a first bias circuit electrically connected to the first latch node and the second side of the first capacitor, the first latch circuit configured to provide a bias voltage at the first latch node;
   a second latch circuit having a second latch node and a second output node, the second latch node being electrically coupled to the signal input node, the second latch circuit comprising a second capacitor coupled between the signal input node on a first side of the second capacitor and the second latch node on a second side of the second capacitor and a second bias circuit electrically connected to the second latch node and the second side of the second capacitor, the second latch circuit configured to provide a bias voltage at the second latch node; and
   an output stage circuit having a first input node, a second input node, and a third output node, the first input node being electrically connected to the first output node, the second input node being electrically connected to the second output node, the output stage circuit being configured to responsively pull up and pull down a voltage of the third output node in response to respective voltages of the first input node and the second input node.

2. The integrated circuit of claim 1, wherein:
   the first latch circuit has a first power node and a second power node, the first power node being electrically connected to a first supply node, the second power node being electrically connected to a second supply node;
   the second latch circuit has a third power node and a fourth power node, the third power node being electrically connected to the second supply node, the fourth power node being electrically connected to a third supply node;

the output stage circuit has a fifth power node and a sixth power node, the fifth power node being electrically connected to the first supply node, the sixth power node being electrically connected to the third supply node; and the first supply node is configured to have a first supply voltage, the second supply node is configured to have a second supply voltage, and the third supply node is configured to have a third supply voltage, the second supply voltage being greater than the first supply voltage, the third supply voltage being greater than the second supply voltage.

3. The integrated circuit of claim 1, wherein:
the first bias circuit includes a first inverter having an input node and an output node both electrically connected to the first latch node; and
the second bias circuit includes a second inverter having an input node and an output node both electrically connected to the second latch node.

4. The integrated circuit of claim 1, wherein:
the first latch circuit includes:
 a first inverter having an input node electrically connected to the first latch node and having an output node electrically connected to the first output node;
 a second inverter having an input node electrically connected to the first output node and having an output node electrically connected to the first latch node; and
 a third inverter having an input node and an output node both electrically connected to the first latch node, the first bias circuit including the third inverter; and
the second latch circuit includes:
 a fourth inverter having an input node electrically connected to the second latch node and having an output node electrically connected to the second output node;
 a fifth inverter having an input node electrically connected to the second output node and having an output node electrically connected to the second latch node; and
 a sixth inverter having an input node and an output node both electrically connected to the second latch node, the second bias circuit including the sixth inverter.

5. The integrated circuit of claim 4, wherein:
the first inverter, the second inverter, and the third inverter each have a respective first power node electrically connected to a first supply node and have a respective second power node electrically connected to a second supply node;
the fourth inverter, the fifth inverter, and the third inverter have a respective first power node electrically connected to the second supply node and have a respective second power node electrically connected to a third supply node;
the output stage circuit comprises:
 a pull-down circuit electrically connected between the third output node and the first supply node, the pull-down circuit having the first input node; and
 a pull-up circuit electrically connected between the third output node and the third supply node, the pull-up circuit having the second input node;
the first supply node being configured to have a first supply voltage;

the second supply node being configured to have a second supply voltage greater than the first supply voltage; and
the third supply node being configured to have a third supply voltage greater than the second supply voltage.

6. The integrated circuit of claim 4, wherein:
the second inverter and the third inverter have a same drivability; and
the fifth inverter and the sixth inverter have a same drivability.

7. The integrated circuit of claim 1, wherein the output stage circuit comprises:
a pull-down circuit electrically connected between the third output node and a first supply node, the pull-down circuit having the first input node, the first supply node being configured to have a first supply voltage; and
a pull-up circuit electrically connected between the third output node and a second supply node, the pull-up circuit having the second input node, the second supply node being configured to have a second supply voltage greater than the first supply voltage.

8. The integrated circuit of claim 7, wherein:
the pull-down circuit comprises an n-type transistor having a source node and a drain node electrically connected between the third output node and the first supply node, a gate node of the n-type transistor being electrically connected to the first input node; and
the pull-up circuit comprises a p-type transistor having a source node and a drain node electrically connected between the third output node and the second supply node, a gate node of the p-type transistor being electrically connected to the second input node.

9. An integrated circuit comprising:
a level shifter circuit comprising:
 a non-level shifting latch circuit having a first latch node and a first output node, the first latch node being electrically coupled to a signal input node of the level shifter circuit, the non-level shifting latch circuit including a first DC bias circuit configured to provide a first DC bias voltage at the first latch node; and
 a level shifting latch circuit having a second latch node and a second output node, the second latch node being electrically coupled to the signal input node of the level shifter circuit, the level shifting latch circuit including a second DC bias circuit configured to provide a second DC bias voltage at the second latch node.

10. The integrated circuit of claim 9, wherein the level shifter circuit further comprises:
a pull-down circuit electrically connected to an output node of the level shifter circuit, the pull-down circuit being configured to pull down a voltage of the output node of the level shifter circuit in response to a voltage of the first output node; and
a pull-up circuit electrically connected to the output node of the level shifter circuit, the pull-up circuit being configured to pull up a voltage of the output node of the level shifter circuit in response to a voltage of the second output node.

11. The integrated circuit of claim 9, wherein:
the first DC bias circuit includes a first inverter having an input node and an output node both electrically connected to the first latch node; and
the second DC bias circuit includes a second inverter having an input node and an output node both electrically connected to the second latch node.

12. The integrated circuit of claim 9, wherein:

the non-level shifting latch circuit has respective power nodes electrically connected to a first supply node and a second supply node, the first supply node being configured to have a first supply voltage, the second supply node being configured to have a second supply voltage greater than the first supply voltage, the non-level shifting latch circuit being configured to output, on the first output node, a signal having a voltage swing between the first supply voltage and the second supply voltage; and the level shifting latch circuit has respective power nodes electrically connected to the second supply node and a third supply node, the third supply node being configured to have a third supply voltage greater than the second supply voltage, the level shifting latch circuit being configured to output, on the second output node, a signal having a voltage swing between the second supply voltage and the third supply voltage.

13. The integrated circuit of claim 12, wherein:
the non-level shifting latch circuit comprises:
 a first inverter having an input node electrically connected to the first latch node, an output node electrically connected to the first output node, a first power node electrically connected to the first supply node, and a second power node electrically connected to the second supply node;
 a second inverter having an input node electrically connected to the first output node, an output node electrically connected to the first latch node, a first power node electrically connected to the first supply node, and a second power node electrically connected to the second supply node; and
 a third inverter having an input node and an output node both electrically connected to the first latch node, a first power node electrically connected to the first supply node, and a second power node electrically connected to the second supply node, the first DC bias circuit including the third inverter; and the level shifting latch circuit comprises:
 a fourth inverter having an input node electrically connected to the second latch node, an output node electrically connected to the second output node, a first power node electrically connected to the second supply node, and a second power node electrically connected to the third supply node;
 a fifth inverter having an input node electrically connected to the second output node, an output node electrically connected to the second latch node, a first power node electrically connected to the second supply node, and a second power node electrically connected to the third supply node; and
 a sixth inverter having an input node and an output node both electrically connected to the second latch node, a first power node electrically connected to the second supply node, and a second power node electrically connected to the third supply node, the second DC bias circuit including the sixth inverter.

14. The integrated circuit of claim 12, wherein the level shifter circuit further comprises an output stage circuit, the output stage circuit comprising:
 a pull-down circuit electrically connected between the first supply node and an output node of the level shifter circuit; and
 a pull-up circuit electrically connected between the output node of the level shifter circuit and the third supply node, the output stage circuit being configured to output, on the output node of the level shifter circuit, an output signal having a voltage swing between the first supply voltage and the third supply voltage.

15. The integrated circuit of claim 9, wherein the level shifter circuit further comprises a buffer circuit having an input node electrically connected to the signal input node and having an output node electrically coupled to the first latch node and the second latch node.

16. A method of operating an integrated circuit, the method comprising:
 receiving an input signal at an input node, the input node being electrically coupled to a first latch node and a second latch node, a non-level shifting latch circuit comprising the first latch node and a first DC bias circuit electrically connected to the first latch node, a level shifting latch circuit comprising the second latch node and a second DC bias circuit electrically connected to the second latch node;
 generating a non-level shifted signal by the non-level shifting latch circuit based on a signal on the first latch node;
 generating a level shifted signal by the level shifting latch circuit based on a signal on the second latch node; and
 outputting an output signal from an output stage circuit, the output stage circuit generating the output signal in response to the non-level shifted signal and the level shifted signal.

17. The method of claim 16, wherein:
the input signal has a voltage swing between a first supply voltage and a second supply voltage, the second supply voltage being greater than the first supply voltage;
the non-level shifted signal has a voltage swing between the first supply voltage and the second supply voltage;
the level shifted signal has a voltage swing between the second supply voltage and a third supply voltage, the third supply voltage being greater than the second supply voltage; and
the output signal has a voltage swing between the first supply voltage and the third supply voltage.

18. The method of claim 16, wherein:
the non-level shifting latch circuit comprises:
a first inverter having an input node electrically connected to the first latch node and having an output node electrically connected to an output node of the non-level shifting latch circuit, the non-level shifted signal being on the output node of the non-level shifting latch circuit;
a second inverter having an input node electrically connected to the output node of the non-level shifting latch circuit and having an output node electrically connected to the first latch node; and
a third inverter having an input node and an output node both electrically connected to the first latch node, the first DC bias circuit including the third inverter; and
the level shifting latch circuit comprises:
a fourth inverter having an input node electrically connected to the second latch node and having an output node electrically connected to an output node of the level shifting latch circuit, the level shifted signal being on the output node of the level shifting latch circuit;
a fifth inverter having an input node electrically connected to the output node of the level shifting latch circuit and having an output node electrically connected to the second latch node; and
a sixth inverter having an input node and an output node both electrically connected to the second latch node, the second DC bias circuit including the sixth inverter.

19. The method of claim 16, wherein the output stage circuit includes a pull-down circuit configured to receive the non-level shifted signal and includes a pull-up circuit configured to receive the level shifted signal.

20. The method of claim 16, wherein a buffer circuit is electrically connected between the input node and the first latch node, and between the input node and the second latch node.

* * * * *